United States Patent
Meldrim et al.

(10) Patent No.: US 9,299,767 B1
(45) Date of Patent: Mar. 29, 2016

(54) SOURCE-CHANNEL INTERACTION IN 3D CIRCUIT

(71) Applicants: John Mark Meldrim, Boise, ID (US); Yushi Hu, Boise, ID (US); Yongjun Jeff Hu, Boise, ID (US); Everett Allen McTeer, Boise, ID (US)

(72) Inventors: John Mark Meldrim, Boise, ID (US); Yushi Hu, Boise, ID (US); Yongjun Jeff Hu, Boise, ID (US); Everett Allen McTeer, Boise, ID (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/498,640

(22) Filed: Sep. 26, 2014

(51) Int. Cl.
*H01L 29/04* (2006.01)
*H01L 27/115* (2006.01)
*H01L 27/105* (2006.01)

(52) U.S. Cl.
CPC ............ *H01L 29/04* (2013.01); *H01L 27/1057* (2013.01)

(58) Field of Classification Search
CPC .................................................. H01L 27/1157
See application file for complete search history.

(56) References Cited

U.S. PATENT DOCUMENTS

| 9,130,054 B2 * | 9/2015 | Jang ...................... H01L 29/792 |
| 2011/0248327 A1 * | 10/2011 | Son .................... H01L 27/11551 |
| | | 257/315 |
| 2012/0008400 A1 * | 1/2012 | Fukuzumi .......... G11C 16/0483 |
| | | 365/185.18 |
| 2013/0148398 A1 * | 6/2013 | Baek ................. H01L 27/11582 |
| | | 365/51 |
| 2013/0334589 A1 * | 12/2013 | Ahn .................... H01L 29/7926 |
| | | 257/324 |
| 2015/0279855 A1 * | 10/2015 | Lu ....................... H01L 27/1157 |
| | | 257/66 |

* cited by examiner

*Primary Examiner* — Lex Malsawma
(74) *Attorney, Agent, or Firm* — Compass IP Law PC

(57) ABSTRACT

A multilayer source provides charge carriers to a multitier channel connector. The source includes a metal silicide layer on a substrate and a metal nitride layer between the metal silicide layer and the channel. The metal silicide and the metal nitride are processed without an intervening oxide layer between them. In one embodiment, the source further includes a silicon layer between the metal nitride layer and the channel. The silicon layer can also be processed without an intervening oxide layer. Thus, the source does not have an intervening oxide layer from the substrate to the channel.

23 Claims, 10 Drawing Sheets

302

304

SOURCE-CHANNEL INTERACTION IN 3D CIRCUIT

FIELD

Embodiments of the invention are generally related to three dimensional circuit devices, and more particularly to providing a source to electrically couple to a channel where the source has low resistance and a reservoir of charge carriers for the channel.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2014, Intel Corporation, All Rights Reserved.

BACKGROUND

There is a general desire for continually smaller size for computing and electronic devices and components, even as higher performance and storage capacity is expected from the devices. Such desire is especially true for memory circuits or memory devices. It will be understood that the more discrete circuit components and the greater the real estate used, the more the devices consume power. Size and power consumption are significant factors in electronics and memory devices, especially for handheld and mobile applications. Recent developments in device manufacturing offer three dimensional (3D) circuit structures to create electronic devices that have higher densities.

However, the physics of various materials and processing techniques introduce performance limitations on resulting high density devices that restrict the commercial viability of such devices. One technique developed with 3D circuit devices is the use of a conductive channel to conduct a current to enable active operation of stacked circuit elements. However, traditional processing has resulted in undesirable effects when electrically connecting a source layer to the channel. Traditional sources have either provided a good reservoir for charge carriers to move into the channel (sources with good GIDL (gate induced drain leakage)) but with high resistance, or sources that have lower GIDL and low resistance. Low resistance sources have traditionally acted as carrier sinks, rather than providing a good source to the channel conductor.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
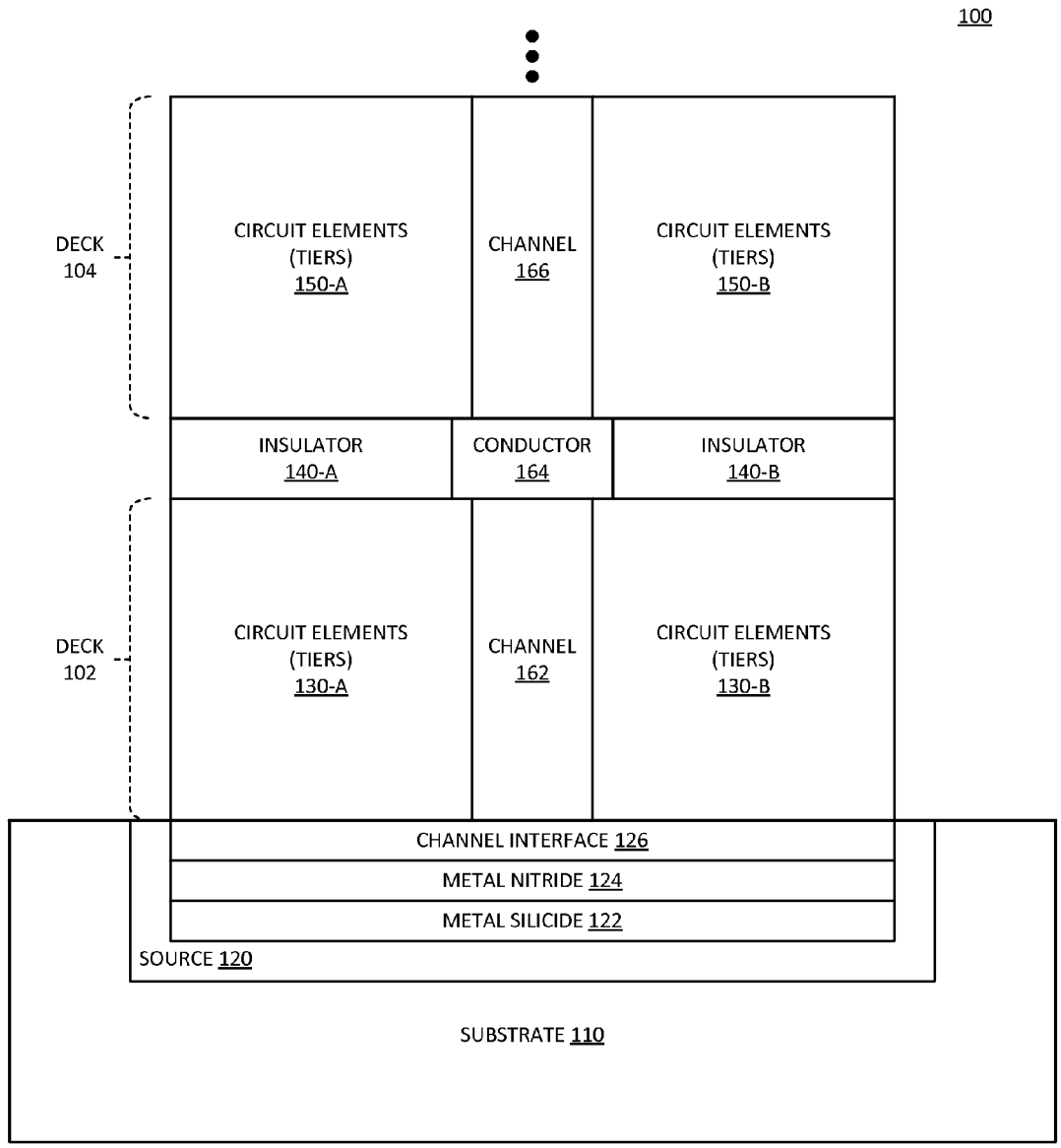
FIG. 1 is a block diagram of an embodiment of a 3D circuit with a multilayer source.

Descriptions of certain details and implementations follow, including a description of the figures, which may depict some or all of the embodiments described below, as well as discussing other potential embodiments or implementations of the inventive concepts presented herein.

DETAILED DESCRIPTION

A multilayer source provides charge carriers to a multitier channel connector. The source includes a metal silicide layer on a substrate and a metal nitride layer between the metal silicide layer and the channel. The metal silicide and the metal nitride are processed without an intervening oxide layer between them. The multilayer source has low resistance, and provides a good reservoir for charge carriers for the channel, offering a desired GIDL (gate induced drain leakage). In one embodiment, the source further includes a silicon layer between the metal nitride layer and the channel to facilitate the interface between the source and the channel. The silicon layer can also be processed without an intervening oxide layer. Thus, the source does not have an intervening oxide layer from the substrate to the channel, which reduces parasitic operational effects.

Traditional source formation for 3D (three dimensional) circuits is based on a polycrystalline silicon (poly) film and/or a metal silicide film. As used herein, "poly" refers generally to doped silicon. It will be understood that poly can be lightly doped or more heavily doped; if there is no specific indication, then generally reference to poly can include lighter or more heavily doped silicon. The poly or metal silicide source is traditionally highly doped and connected to a channel processed from a poly conductor. Dopants from the source are required to diffuse up the channel to conduct current for active operation of the circuit elements coupled to the channel. Traditional source processing has focused on a pure poly source, a pure silicide source, or a poly/silicide hybrid.

A pure poly source acts as a good reservoir for dopants and interfaces well with a poly channel. The poly source interfaces well with a poly channel because there are known processing techniques to avoid the formation of an intervening oxide layer, which would negatively impact the flow of source dopants, especially at higher-frequency operation. However, a pure poly source has a significant amount of resistance, which significantly restricts the operating frequency and operating voltage of the resulting device. The resulting devices do not operate within desired parameters for memory devices for modern computing systems.

A pure silicide source offers lower resistance than a pure poly source. An example of a pure silicide source is tungsten silicide (WSix). It will be understood that chemical formula representations such as WSix (and others used herein) are generic representations of a chemical compound rather than a specific chemical formula. Each representation refers to a metal or metallic atom as the first element with at second element following. The 'x' at the end of the chemical formula representation indicates that the compound will include one or more of the first atom combined with one or more of the second atom. The exact numbers of atoms of each compound could vary by implementation and/or processing technique, and is thus not specified herein.

WSix is a highly conductive silicide. WSix is a low resistance source, but dopants or charge carriers tend to sink into the silicide, rather than diffusing into the channel. Thus, pure metal silicide tends to be a poor reservoir for dopants. Additionally, the interface between a silicide source and a poly channel is poly on silicide, which does not form in traditional processing without an intervening oxidation (oxide) layer. Thus, not only does the silicide act as a sink for charge carriers, the oxide layer can prevent dopants from diffusing into the channel.

The source can be a poly and silicide stack, such as a layer of poly on a layer of WSix. Such a source has low resistance. Additionally, the poly on the WSix can form a poly to poly interface between the source and the channel. However, as with the pure silicide source discussed above, the silicide will act as a large sink of dopants, which prevent the dopants from diffusing into the channel. Additionally, processing a poly layer on the WSix with traditional processing will form a layer of oxide between the source WSix and the source poly which can cause coupling at high frequencies. Even if the processing can be performed without an intervening oxide layer between the WSix and poly, the WSix acts as a dopant sink, which reduces the number of dopants available to diffuse into the channel.

By creating a source with a layer of silicide (e.g., WSix) on the substrate, the source can have lower resistance as desired. By processing a layer nitride (e.g., TiN) on the layer of silicide, the nitride can act as a barrier to dopants, which would prevent the charge carriers from sinking into the silicide. The source can have an interface with the channel that allows dopants to diffuse into the channel. In one embodiment, the interface includes a silicon layer, which can include a poly layer. In one embodiment, the interface can include other material processed on the nitride layer to create an electrical contact with the channel without an intervening oxide layer.

The channel provides a conductive channel to conduct current for active operation of multiple tiers of circuit elements processed on the source. The multiple tiers can be processed as one or more stacks of tiers. In one embodiment, each tier of the stack includes a memory cell device or multiple memory cell devices. A circuit using such a multitier stack can include a select gate source polycrystalline (SGS poly) layer adjacent the multitier stack of memory cells, where the SGS poly layer can provide a gate select signal for the memory cells of the multitier stack. The SGS poly layer would typically be located between the source and the multiple tiers of circuit elements. In one embodiment, each tier includes NAND memory cells. Thus, the circuit device is a 3D memory device. In one embodiment, the processing builds a hollow channel the multiple tiers. The channel connected to the source can be charged to produce a voltage across a gate for each circuit element, thus activating the circuit element.

The following descriptions refer to the accompanying drawings. It will be understood that the drawings do not necessarily set out elements or components to scale. Certain elements are intentionally drawn out of proportion for purposes of illustration and discussion. It will also be understood that specific examples refer to vertical stacking of circuit elements and decks of circuit element, one on top of the other. In one embodiment, the multiple tiers and/or decks could be configured horizontally.

FIG. 1 is a block diagram of an embodiment of a 3D circuit with a multilayer source. System 100 represents an electronic circuit device that uses multiple decks of tiers of circuit element. Instead of processing all circuit elements in a single stack and attempting to create a channel to operate all the circuit elements, system 100 is processed in layers, with multiple decks of circuit elements.

Substrate 110 represents a substrate or semiconductor platform on which the electronic circuit is processed. System 100 represents a cross section of the electronic circuit, and it will be understood that typically many such circuits would be processed simultaneously on a semiconductor wafer. The processing creates source 120 in or on substrate 110. As used herein, creating a circuit element refers to depositing, growing, or otherwise physically adding material to the circuit. Creating the circuit can also refer to processing operations such as annealing, or otherwise adhering one material on another material. In one embodiment, the material is created in layer, which can refer to any thickness of material. Typically, the creating involves chemical processing, such as CVD (chemical vapor deposition), PVD (physical vapor deposition), epitaxial growth, or other known process to add material onto another material and/or to combine materials.

Source 120 can activate or control the circuit operation of the circuit elements of system 100 (e.g., elements 130 and 150). Source 120 includes metal silicide 122, metal nitride 124, and channel interface 126. Metal silicide 122 includes a compound of a metal or metallic element with silicon. In one embodiment, the metal can include tungsten (W), titanium (Ti), nickel (Ni), cobalt (Co), tantalum (Ta), platinum (Pt), or molybdenum (Mo), or an alloy including at least one of the selected metals. When metal silicide 122 is highly conductive it will provide low resistance for source 120. Metal nitride 124 includes a compound of a refractory metal or metallic element with nitrogen. In one embodiment, the metal or metallic element can include titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected elements. The choice of metal nitride 124 can be a compound that provides dopant isolation between channel interface 126 and metal silicide 122. Thus, the dopants will diffuse into channel 162 instead of into metal silicide 122.

Figure 2:
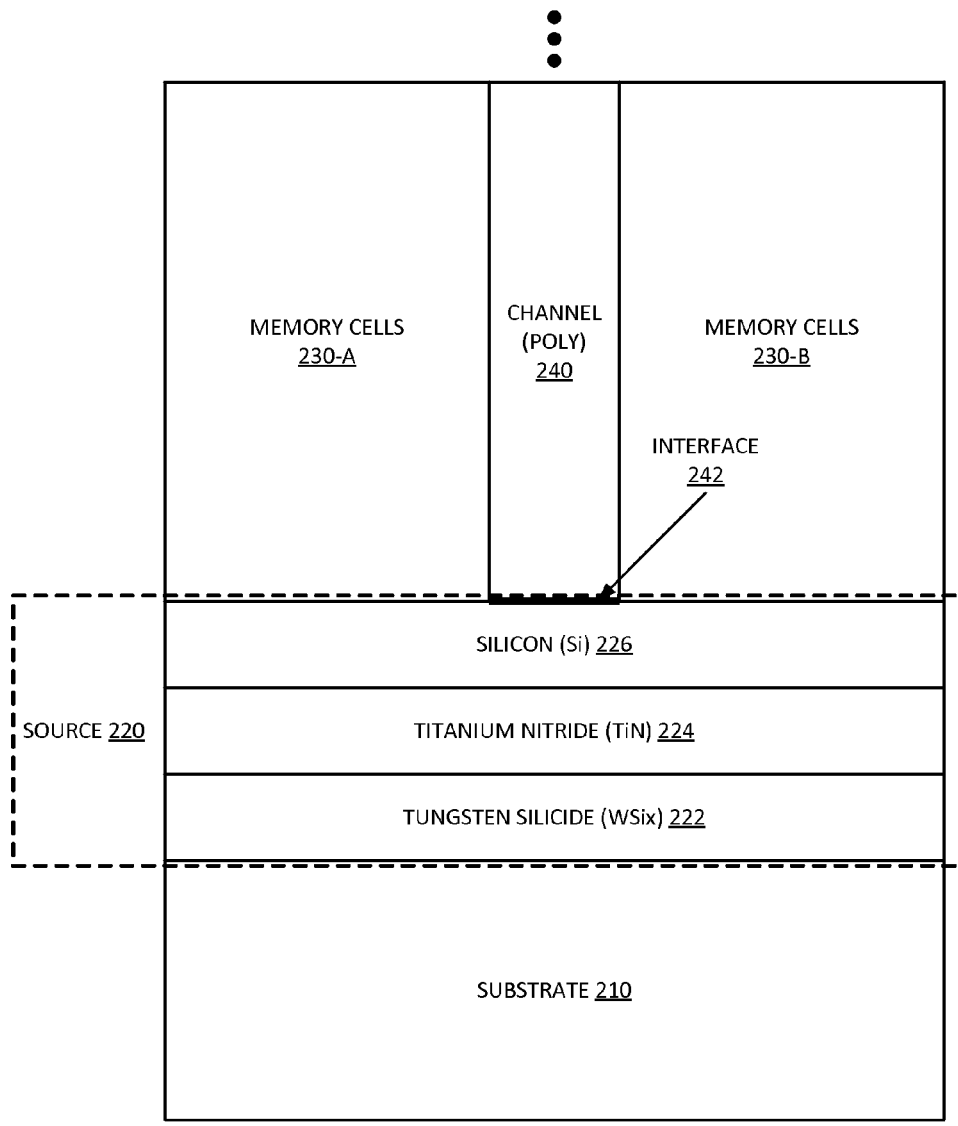
FIG. 2 is a block diagram of an embodiment of a 3D circuit with source having a silicide layer, a nitride layer, and a silicon layer.

In one embodiment, channel interface 126 is another layer of material in source 120. In one embodiment, channel interface 126 is an area between metal nitride 124 and channel 162, but not necessarily between circuit elements 130 and metal nitride 124, such as an area that has been etched or otherwise prepared to interconnect channel 162 to metal nitride 124. System 200 of FIG. 2 illustrates one example of an embodiment where channel interface 126 is a layer of silicon material.

Deck 102 includes circuit elements 130 (elements 130-A and 130-B) which are activated as a current flows in channel 162. In one embodiment, channel 162 is doped poly. Channel 162 can alternatively be another conductive material that can interface with metal nitride 124 via a specific layer or material in channel interface 126. It will be understood that while shown as elements 'A' and 'B,' deck 102 can include multiple circuit elements 130 that are separately activated as current flows in channel 162. The labels of 'A' or 'B' are only for illustrative purposes. Circuit elements 130 are created in tiers within deck 102. Thus, multiple circuit elements 130 can be stacked adjacent (e.g., vertically adjacent) to each other within deck 102. Deck 102 can include anywhere from a few circuit elements to dozens of circuit elements (e.g., several dozen memory cells). Channel 162 extends the entire height/length of deck 102 to source 120, and provides electrical connectivity from source 120 for active operation of circuit elements 130. Channel 162 extends from one end of the deck to the other end of the deck (e.g., top to bottom in a vertical stack, or side to side in a horizontal stack/row).

In one embodiment, system 100 includes multiple decks, as illustrated by deck 104, which is built or processed adjacent to deck 102. Deck 104 includes circuit elements 150 (elements 150-A and 150-B). In one embodiment, circuit elements 130 and 150 are each stacked vertically as tiers of circuit elements within their respective decks. In one embodiment, the processing that creates circuit elements 150 is the same as the processing that creates circuit elements 130, but performed in a different deck separated by certain decks processing operations. In one embodiment, conductor 164 is processed at the end of channel 162, and provides electrical connectivity of channel 166 of deck 104 to channel 162 of deck 102, and thus to source 120. Conductor 164 can be a highly conductive material or metallic material to provide the electrical connectivity.

System 100 explicitly illustrates two decks, deck 102 and deck 104. It will be understood that the separation of the elements in the different decks, as well as the high conductivity of the conductive channels and conductor connecting the decks theoretically allows any number of decks to be stacked in system 100. Thus, the total number of circuit elements in system 100 can be doubled, tripled, or more, relative to what the real estate would traditionally allow, because on the stacking.

In one embodiment, the processing can create at least metal silicide 122 and metal nitride 124 of source 120 without air breaks, such as in a vacuum. Creating the layers within a vacuum is one process to generate layers 122 and 124 without an intervening oxide layer. In one embodiment, layers 122 and 124 are generated without an intervening oxide layer by processing with an air break, and performing an appropriate cleaning operation between layers to remove any oxide. In one embodiment, depending on the materials used for metal silicide 122 and/or for metal nitride 124, source 120 can include an adhesion layer processed between the metal silicide and the metal nitride. The adhesion layer can be a layer of material that will cause the silicide and nitride to bond together during the processing.

FIG. 2 is a block diagram of an embodiment of a 3D circuit with source having a silicide layer, a nitride layer, and a silicon layer. System 200 can be one example of a circuit in accordance with system 100 of FIG. 1. System 200 includes substrate 210, which is a semiconductor substrate such as a wafer on which the circuit is processed. Source 220 is processed on substrate 210. Source 220 is a low resistance source that has high GIDL to provide charge carriers to channel 240.

In one embodiment, source 220 includes layer 222 of tungsten silicide WSix or another silicide. In one embodiment, source 220 includes layer 224 of titanium nitride (TiN) or another nitride. In one embodiment, source 220 includes layer 226 of silicon (Si). Si 226 can include PVD Si, CVD Si, and/or other silicon material. In one embodiment, Si 226 is pure poly without other silicon. In one embodiment, silicon layer 226 includes multiple different layers of silicon, such as an undoped silicon layer and a polysilicon layer.

In one embodiment, source 220 includes a stack of WSix (222), TiN (224), and PVD Si and/or poly (226) processed without air breaks. In one embodiment, after breaking the vacuum and making suitable cleans, the processing deposits diffusion polysilicon on layer 226 under a controlled queue time. The PVD Si can be as thin as 50 Angstroms (A). By depositing layers 222, 224, and 226 without air breaks, there are no oxide interfaces between the metal and silicon films. In one embodiment, the processing deposits the layers with air breaks and includes operations to remove oxide that forms from exposure to air. The silicide layer allows for a thermally stable, low resistance source. In one embodiment where diffusion poly is processed on PVD Si, the PVD Si to diffusion poly interface can be formed without an oxide layer. Si layer 226 formed on TiN 224 can be implanted with high doses of dopant to form a reservoir. TiN layer 224 can be as thin as 50-75 A, and acts as a diffusion barrier keeping the dopants from sinking into WSix 222. The diffusion barrier of the nitride layer provides dopant segregation. Si layer 226 can make interface 242 be a silicon to silicon interface formed without an oxide layer.

FIGS. 3A-3G are block diagrams of an embodiment of various processing stages for a 3D circuit with a multilayer source. For purposes of example, FIGS. 3A-3G illustrate a three-dimensional stacked circuit device, with multiple tiers of circuit elements. The circuit device can be a memory device. The example in FIGS. 3A-3G provides one example embodiment of a vertically stacked circuit device. In one embodiment, such processing can occur in a "horizontal" manner, but for a device that is stacked out from a semiconductor substrate or wafer. Thus, in one embodiment, "vertical" stacking can refer to any processing that extends circuit elements out or up and away from the semiconductor substrate on which the devices are processed and/or placed for operation.

Figure 3A:
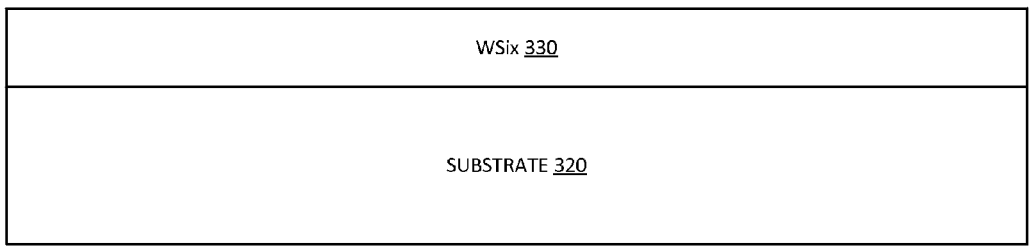
FIGS. 3A-3G are block diagrams of an embodiment of various processing stages for a 3D circuit with a multilayer source.
Figure 3B:
Figure 3C:
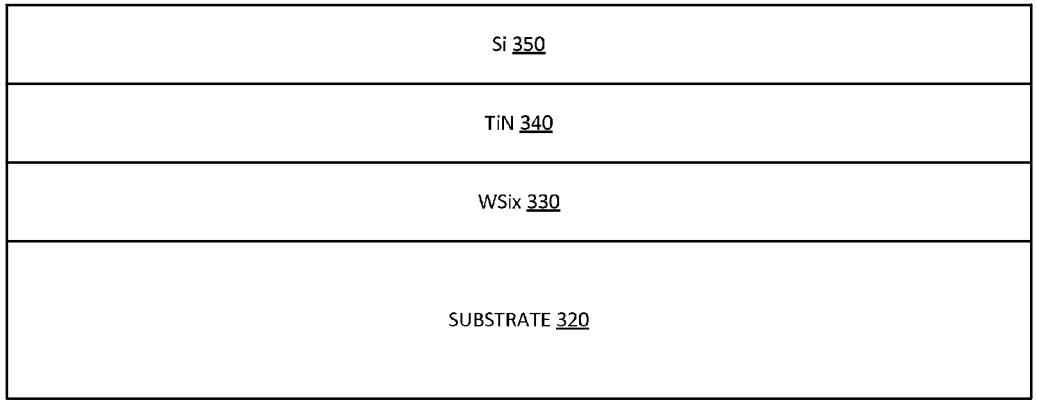
Figure 3D:
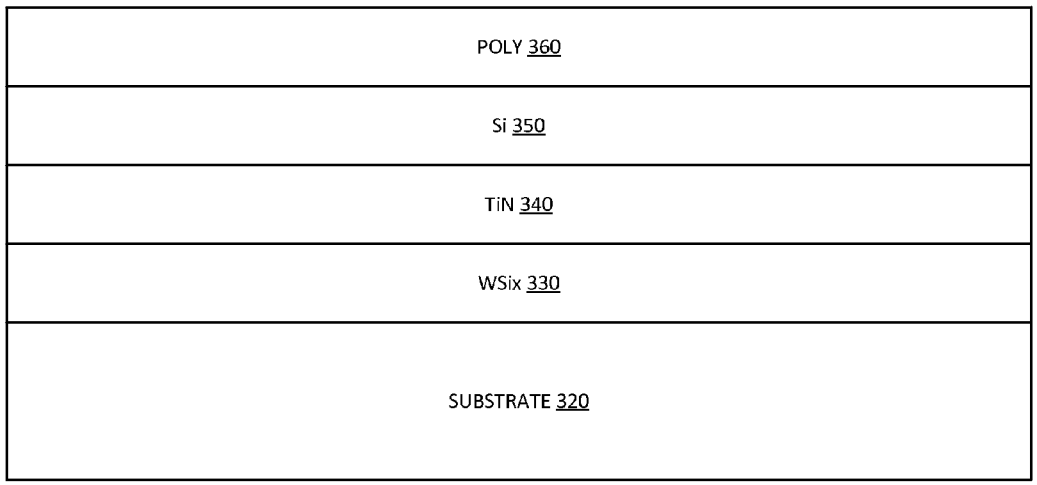

FIG. 3A illustrates circuit state 302, in which the processing creates WSix 330 on substrate 320. FIG. 3B illustrates circuit state 304, in which the processing creates TiN 340 on substrate 330. FIG. 3C illustrates circuit state 306, in which the processing creates Si 350 on substrate 340. In one embodiment, Si 350 is pure silicon (which can be undoped silicon). FIG. 3D illustrates circuit state 308, in which the processing creates poly 360 on Si 350. In one embodiment, the processing creates WSix 330, TiN 340, and Si 350 under vacuum. The processing can allow an air break after Si 350 is created without causing an intervening oxide layer because processing poly onto Si without an oxide layer is a well-known process.

Figure 3E:
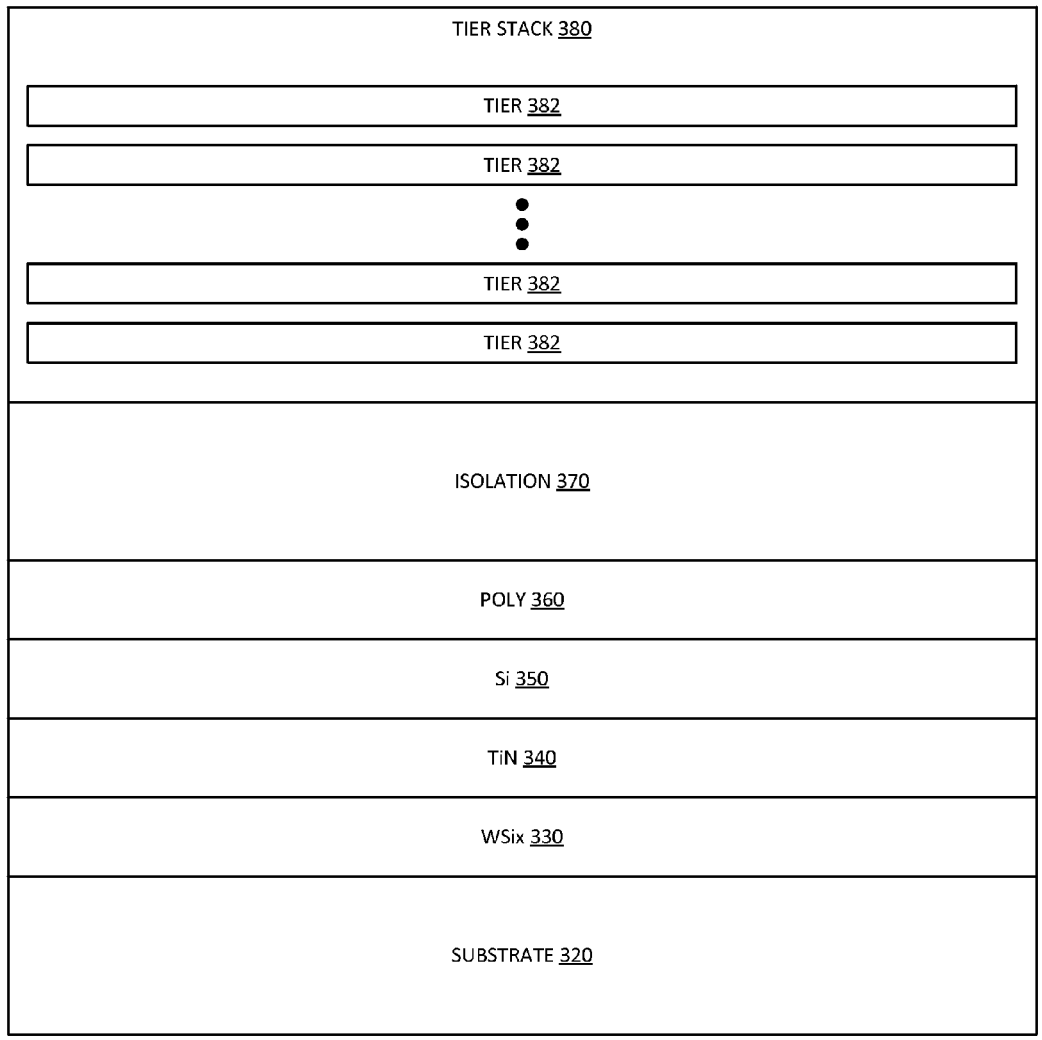

FIG. 3E illustrates circuit state 310, in which multiple circuit element tiers 382 on the source and substrate 320. In one embodiment, the processing creates isolation layer 370 on poly 360 or other layer of the source that is directly adjacent the multitier stack of circuit elements. Isolation layer 370 can include oxide, which may include special layers for etch stopping. Isolation layer 370 includes an SGS layer to activate the gates of the circuit elements. In one embodiment, the circuit also includes a gate poly layer, which is not specifically shown.

In one embodiment, the processing dopes poly 360 with a free-carrier conductor, such as an n-type dopant to create n-type polysilicon. It will be understood that n-type materials have free electrons that provide current flow (by providing charge), while p-type materials have free holes that provide current flow (by receiving charge). In one embodiment, a gate poly can include p-type doped polysilicon. Tier stack 380 with multiple tiers 382 are processed on isolation layer 370. Tier stack 380 can include alternating layers of insulator material (e.g., oxide) and conductive material (e.g., doped poly) and tiers 382, which represent the circuit elements to be activated by electrical connection to the source (WSix 330, TiN 340, Si 350, and poly 360).

Figure 3F:
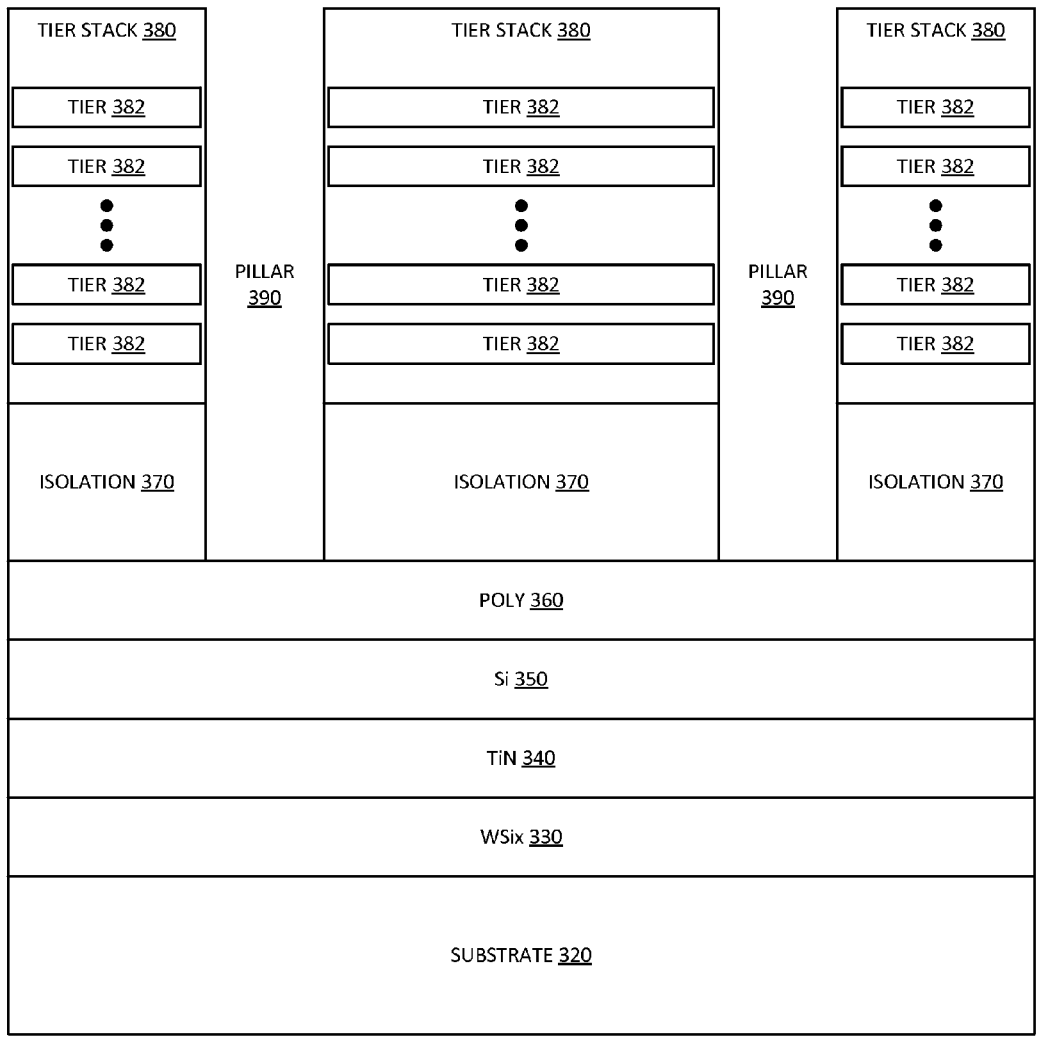

FIG. 3F illustrates circuit state 312, in which the processing creates one or more pillars for channel conductors. In one embodiment, the processing creates one or more pillars 390 (e.g., such as by punch etch), which pillars provide an opening through tier stack 380, through isolation 370 and to poly 360. As mentioned above, in one embodiment, the layer or layers illustrated as isolation 370 include an etch stop layer to provide a clean etch all the way to poly 360 without cutting too much into poly 360. After creating the initial pillars 390, the processing cleans pillars 390 and exposes the source (poly 360).

Figure 3G:
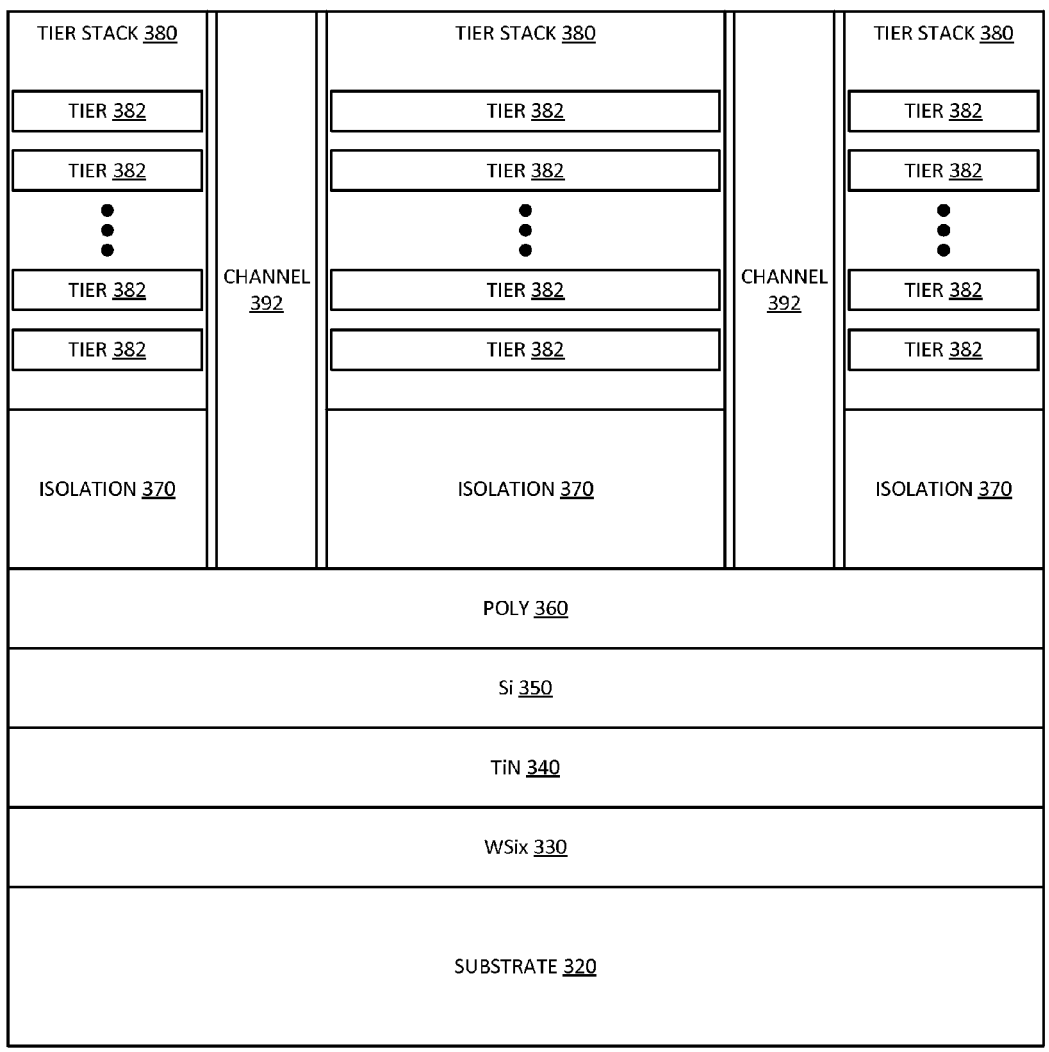

FIG. 3G illustrates circuit state 314, in which the processing creates conductive channels to conduct current for the circuit elements of tiers 382. The processing creates channels 392 from pillars 390. In one embodiment, the processing first creates gates (not specifically shown) on each tier 382, and then creates a conductor channel in the pillars. Channels 392 represent a pillar with a conductor created on the walls and the base (the part closest to poly 360). In one embodiment, channels 392 are hollow channels which include a thin layer of conductor and filled with an insulator (e.g., oxide) that the conductor surrounds. In one embodiment, the thickness of the conductor on the walls is controlled for improved distribution of threshold voltages and for improvement of leakage current when the channel is turned off. Channels 392 form a poly to poly contact with poly 360. Thus, channels 392 provide electrical connectivity from the multilayer source to tiers 382.

Figure 4:
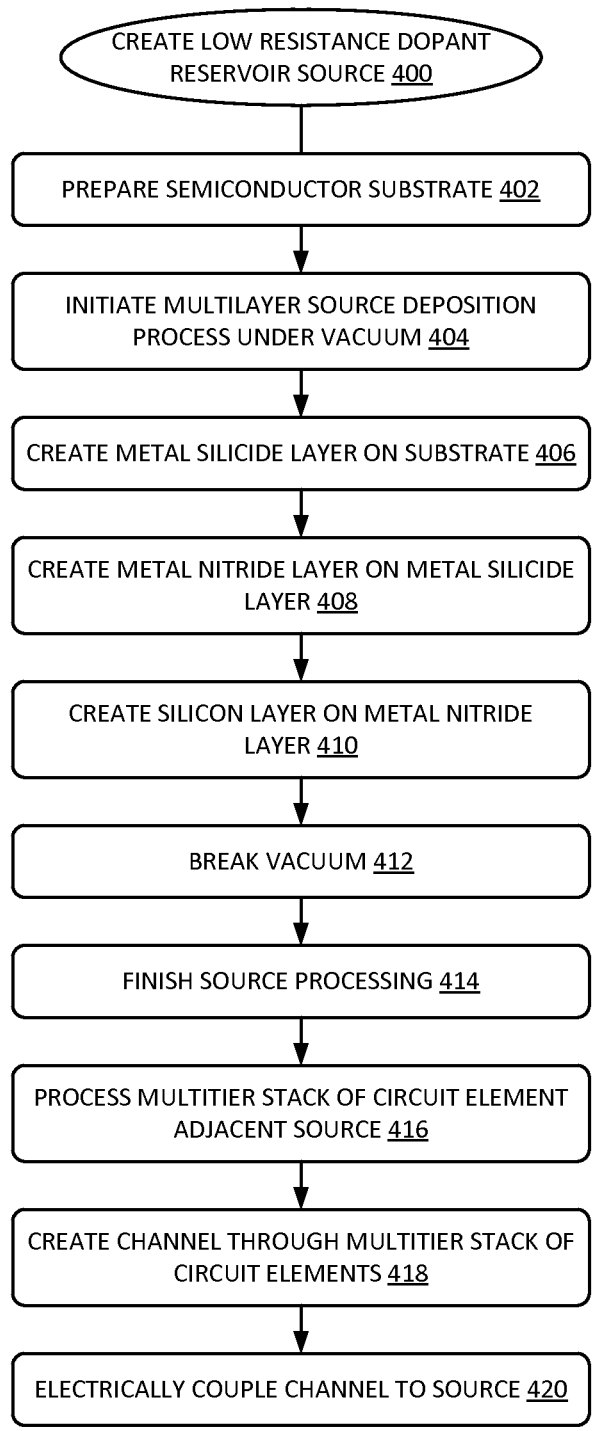
FIG. 4 is a flow diagram of an embodiment of a process for creating a stacked circuit with a multilayer source.

FIG. 4 is a flow diagram of an embodiment of a process for creating a stacked circuit with a multilayer source. Process 400 can create a low resistance source that acts as a good reservoir for dopants. Process 400 can be one example of a process to produce circuits and circuit states such as or similar to those of FIGS. 3A-3G, system 100 of FIG. 1, and/or system 200 of FIG. 2. Process 400 can be executed by processing equipment of a manufacturing entity. The manufacturer configures the processing equipment and performs a series of processing steps or operations on a semiconductor wafer to create the electronic circuits. The processing equipment can include tools to perform any type of materials processing operations (deposit, CMP, etch, ion implant, annealing, other). Such processing equipment includes computer equipment and mechanical and electrical tools that perform the processing. The processing equipment is controlled by one or more processing operation controls, which can include hardware logic and/or software/firmware logic to control the processing. The equipment can be programmed or configured to perform certain operations in a certain order. Collectively the equipment and processing or configuration can be referred to as a processing system. For purposes of process 400, the operations are described as being performed by "the processing," which refers indirectly to the processing system used by the manufacturer.

The processing prepares a semiconductor substrate for a 3D circuit with a multilayer source, 402. The semiconductor substrate can be, for example, a silicon wafer. In one embodiment, the processing initiates the creation of a multilayer source via deposition under vacuum, 404. By creating the layers under vacuum, there will not be air breaks, which can eliminate the creation of intervening oxide layers. Even by performing the source creation under a vacuum, the source needs to include materials that allow for low resistance, while providing proper dopant diffusion (meaning into the channel and not into a layer of the source). In one embodiment, the processing forms the layers not under vacuum, and includes one or more additional operations to clean native oxide between layers to result in a circuit that does not have oxide between layers.

The processing creates a metal silicide layer on the substrate, 406. The metal silicide can be selected to provide low resistivity to the source. The processing creates a metal nitride layer on the silicide, 408. In one embodiment, the processing creates a layer of silicon on the nitride, 410. In one embodiment, the silicon layer includes an undoped silicon layer. In one embodiment, the silicon layer includes doped silicon. In one embodiment, the silicon layer includes polysilicon. The processing can break the vacuum processing, 412, and perform finishing processing on the source, 414. The finishing processing can include cleaning and/or the application of other layers to the source. For example, the processing can deposit a layer of silicon without breaking vacuum from the deposition of the silicide and nitride, and then deposit another layer of silicon on the silicon, not in vacuum.

In one embodiment, the processing processes a multitier stack of circuit elements adjacent the source, 416. The processing creates a conductive channel through the multitier stack of circuit elements to contact the source, 418. The processing electrically couples the channel to the source, such as with the deposition of a conductive material and an annealing process. Thermal processing can be used to diffuse dopants or charge carriers from the source reservoir into the channel. In one embodiment, the multilayer source improves SGS device threshold voltage (Vt) degradation through memory device cycling, due to more dopant being available from the source reservoir. Thus, the availability of dopants from the source reservoir can reduce Vt degradation (e.g., with respect to an SGS layer).

Figure 5:
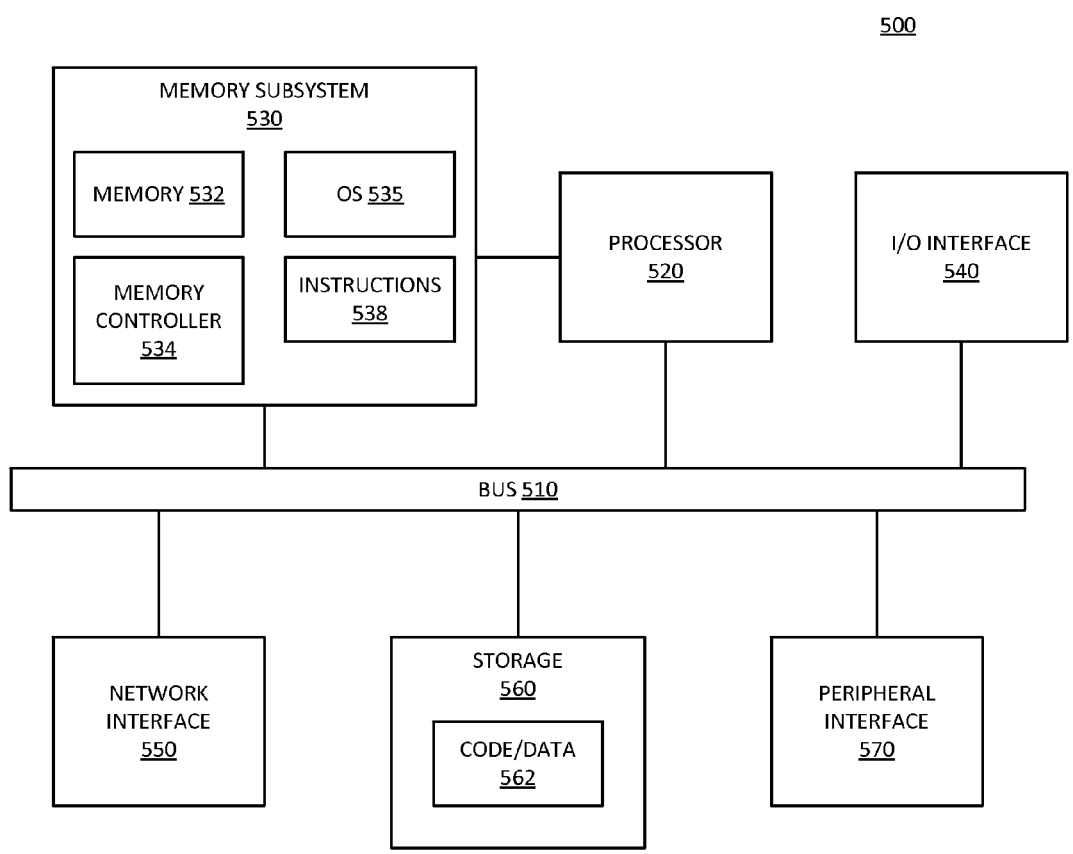
FIG. 5 is a block diagram of an embodiment of a computing system in which a stacked circuit with a multilayer source can be implemented.

FIG. 5 is a block diagram of an embodiment of a computing system in which a stacked circuit with a multilayer source can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500. Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). In one embodiment, I/O interface 540 can include a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. High definition can also refer to projected displays (e.g., head-mounted displays) that have comparable visual quality to pixel displays. Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, system 500 includes components that include elements created as stacked circuits with a multilayer source in accordance with any embodiment described herein. For example, memory devices 532 of memory subsystem 530 and/or other components of system 500 can include elements created as stacked circuits with a multilayer source in accordance with any embodiment described herein. The multilayer source includes a silicide layer to provide low resistivity and a nitride layer on the silicide layer to prevent charge carriers from sinking into the silicide. The source can include a dopant reservoir on the silicide layer to provide charge carriers to the channel that couples to the stacked circuit elements and to provide an interface to the channel conductor.

Figure 6:
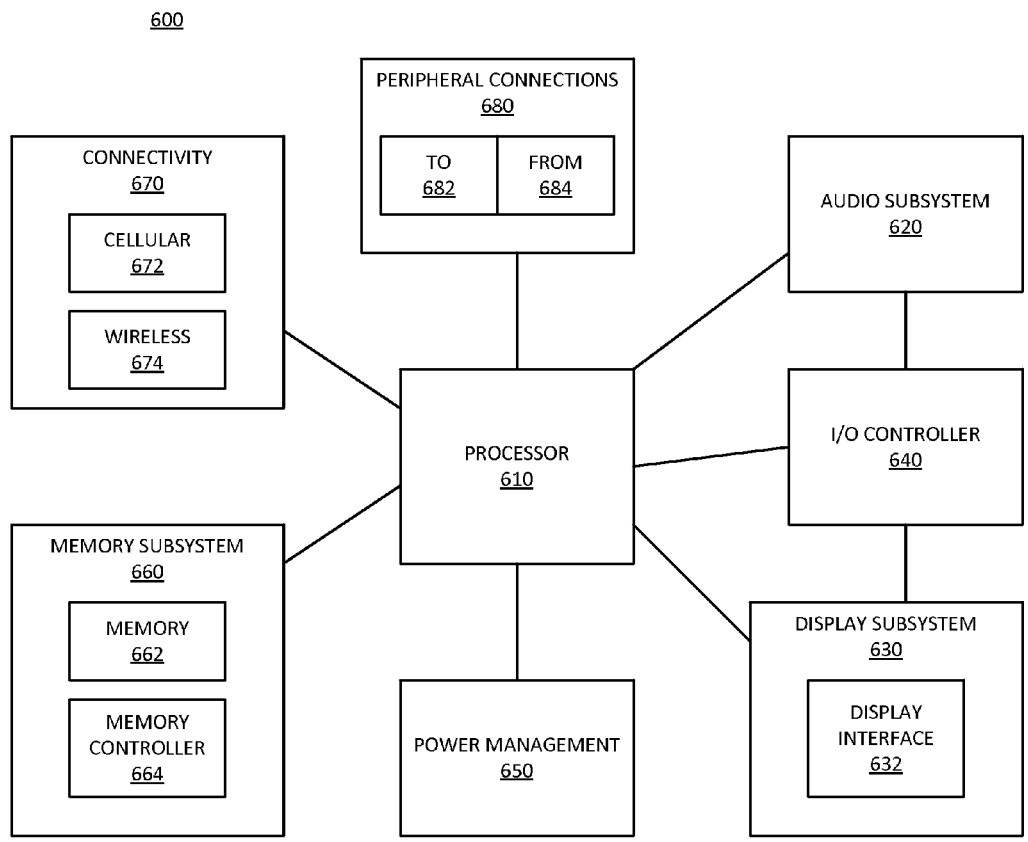
FIG. 6 is a block diagram of an embodiment of a mobile device in which a stacked circuit with a multilayer source can be implemented.

FIG. 6 is a block diagram of an embodiment of a mobile device in which a stacked circuit with a multilayer source can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user. In one embodiment, display subsystem 630 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others. High definition can also refer to projected displays (e.g., head-mounted displays) that have comparable visual quality to pixel displays.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 600 includes components that include elements created as stacked circuits with a multilayer source in accordance with any embodiment described herein. For example, memory devices 662 of memory subsystem 660 and/or other components of system 600 can include elements created as stacked circuits with a multilayer source in accordance with any embodiment described herein. The multilayer source includes a silicide layer to provide low resistivity and a nitride layer on the silicide layer to prevent charge carriers from sinking into the silicide. The source can include a dopant reservoir on the silicide layer to provide charge carriers to the channel that couples to the stacked circuit elements and to provide an interface to the channel conductor.

In one aspect, a circuit device with a three dimensional circuit, comprising: multiple tiers of circuit elements stacked adjacent each other, each tier including a circuit element activated via a gate; a channel extending through the multiple tiers of circuit elements, the channel including doped polycrystalline (poly) material to produce a voltage differential across the gate; and a source electrically coupled to the channel to provide charge carriers to the channel, the source including a metal silicide layer on a substrate, and a metal nitride layer between the metal silicide layer and the channel, wherein the metal nitride is processed onto the metal silicide without an intervening oxide layer.

In one embodiment, the metal silicide layer comprises a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals. In one embodiment, the metal nitride layer comprises a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements. In one embodiment, the metal silicide is processed on the substrate under vacuum, and the metal nitride is processed onto the metal silicide without breaking vacuum. In one embodiment, further comprising: an adhesion layer processed between the metal silicide and the metal nitride. In one embodiment, further comprising: a select gate source (SGS) layer adjacent the source, wherein the source provides dopants to the SGS layer to improve SGS threshold voltage (Vt) degradation. In one embodiment, further comprising: a silicon layer between the metal nitride layer and the channel. In one embodiment, the metal silicide is processed on the substrate under vacuum, the metal nitride is processed onto the metal silicide without breaking vacuum, and the silicon layer is processed on the metal nitride without breaking vacuum. In one embodiment, the silicon layer comprises a polysilicon layer.

In one aspect, an electronic device with a memory device, comprising: a three-dimensional stacked memory device to store data, the memory device including: multiple tiers of memory elements stacked adjacent each other, each tier including a memory element activated via a gate; a channel extending through the multiple tiers of memory elements, the channel including doped polycrystalline (poly) material to produce a voltage differential across the gate; and a source electrically coupled to the channel to provide charge carriers to the channel, the source including a metal silicide layer on a substrate, and a metal nitride layer between the metal silicide layer and the channel, wherein the metal nitride is processed onto the metal silicide without an intervening oxide layer; and a touchscreen display coupled to generate a display based on data accessed from the memory elements.

In one embodiment, the metal silicide layer comprises a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals. In one embodiment, the metal nitride layer comprises a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements. In one embodiment, the metal silicide is processed on the substrate under vacuum, and the metal nitride is processed onto the metal silicide without breaking vacuum. In one embodiment, the memory device further comprising: an adhesion layer processed between the metal silicide and the metal nitride. In one embodiment, the memory device further comprising: a select gate source (SGS) layer adjacent the source, wherein the source provides dopants to the SGS layer to improve SGS threshold voltage (Vt) degradation. In one embodiment, the memory device further comprising: a silicon layer between the metal nitride layer and the channel. In one embodiment, the metal silicide is processed on the substrate under vacuum, the metal nitride is processed onto the metal silicide without breaking vacuum, and the silicon layer is processed on the metal nitride without breaking vacuum. In one embodiment, the silicon layer comprises a polysilicon layer.

In one aspect, a method for creating a three dimensional circuit including: creating a source including a metal silicide layer on a substrate, and a metal nitride layer on the metal silicide layer, including processing the metal nitride onto the metal silicide without an intervening oxide layer; generating a multitier stack of memory cells, each tier of the stack including a memory cell device activated via a gate; and creating a channel extending through the multiple tiers of memory cells, the channel including doped polycrystalline (poly) material to conduct a current when a voltage differential across the gate activates the memory cells, the channel electrically coupled to the source for the source to provide charge carriers to the channel.

In one embodiment, creating the source comprises creating a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals. In one embodiment, creating the source comprises creating a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements. In one embodiment, creating the source without an intervening oxide layer further comprises: processing the metal silicide on the substrate under vacuum; and processing the metal nitride onto the metal silicide without breaking vacuum. In one embodiment, further comprising: depositing an adhesion layer on the metal silicide before depositing the metal nitride. In one embodiment, creating the source further comprises: depositing a silicon layer on the metal nitride layer. In one embodiment, depositing the silicon layer on the metal nitride layer comprises processing the silicon layer without breaking vacuum. In one embodiment, depositing the silicon layer comprises depositing a polysilicon layer.

In one aspect, an article of manufacture comprising a computer readable storage medium having content stored thereon, which when executed performs operations for creating a three dimensional circuit, including: creating a source including a metal silicide layer on a substrate, and a metal nitride layer on the metal silicide layer, including processing the metal nitride onto the metal silicide without an intervening oxide layer; generating a multitier stack of memory cells, each tier of the stack including a memory cell device activated via a gate; and creating a channel extending through the multiple tiers of memory cells, the channel including doped polycrystalline (poly) material to conduct a current when a voltage differential across the gate activates the memory cells, the channel electrically coupled to the source for the source to provide charge carriers to the channel.

In one embodiment, the content for creating the source comprises content for creating a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals. In one embodiment, the content for creating the source comprises content for creating a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements. In one embodiment, the content for creating the source without an intervening oxide layer further comprises content for processing the metal silicide on the substrate under vacuum; and processing the metal nitride onto the metal silicide without breaking vacuum. In one embodiment, further comprising content for depositing an adhesion layer on the metal silicide before depositing the metal nitride. In one embodiment, the content for creating the source further comprises content for depositing a silicon layer on the metal nitride layer. In one embodiment, the content for depositing the silicon layer on the metal nitride layer comprises content for processing the silicon layer without breaking vacuum. In one embodiment, the content for depositing the silicon layer comprises content for depositing a polysilicon layer.

In one aspect, an apparatus for creating a three dimensional circuit including: means for creating a source including a metal silicide layer on a substrate, and a metal nitride layer on the metal silicide layer, including processing the metal nitride onto the metal silicide without an intervening oxide layer; means for generating a multitier stack of memory cells, each tier of the stack including a memory cell device activated via a gate; and means for creating a channel extending through the multiple tiers of memory cells, the channel including doped polycrystalline (poly) material to conduct a current when a voltage differential across the gate activates the memory cells, the channel electrically coupled to the source for the source to provide charge carriers to the channel.

In one embodiment, the means for creating the source comprises means for creating a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals. In one embodiment, the means for creating the source comprises means for creating a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements. In one embodiment, the means for creating the source without an intervening oxide layer further comprises means for processing the metal silicide on the substrate under vacuum; and processing the metal nitride onto the metal silicide without breaking vacuum. In one embodiment, further comprising means for depositing an adhesion layer on the metal silicide before depositing the metal nitride. In one embodiment, the means for creating the source further comprises means for depositing a silicon layer on the metal nitride layer. In one embodiment, the means for depositing the silicon layer on the metal nitride layer comprises means for processing the silicon layer without breaking vacuum. In one embodiment, the means for depositing the silicon layer comprises means for depositing a polysilicon layer.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A circuit device comprising:
   multiple tiers of circuit elements stacked adjacent each other, each tier including a circuit element activated via a gate;
   a channel extending through the multiple tiers of circuit elements, the channel including doped polycrystalline (poly) material to produce a voltage differential across the gate; and
   a source electrically coupled to the channel to provide charge carriers to the channel, the source including a metal silicide layer on a substrate, and a metal nitride layer between the metal silicide layer and the channel, wherein the metal nitride layer is processed onto the metal silicide layer without an intervening oxide layer.

2. The circuit device of claim 1, wherein the metal silicide layer comprises a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals.

3. The circuit device of claim 1, wherein the metal nitride layer comprises a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements.

4. The circuit device of claim 1, wherein the metal silicide is processed on the substrate under vacuum, and the metal nitride is processed onto the metal silicide without breaking vacuum.

5. The circuit device of claim 4, further comprising:
   an adhesion layer processed between the metal silicide and the metal nitride.

6. The circuit device of claim 1, further comprising:
   a select gate source (SGS) layer adjacent the source, wherein the source provides dopants to the SGS layer to improve SGS threshold voltage (Vt) degradation.

7. The circuit device of claim 1, further comprising:
   a silicon layer between the metal nitride layer and the channel.

8. The circuit device of claim 7, wherein the metal silicide is processed on the substrate under vacuum, the metal nitride is processed onto the metal silicide without breaking vacuum, and the silicon layer is processed on the metal nitride without breaking vacuum.

9. The circuit device of claim 7, wherein the silicon layer comprises a polysilicon layer.

10. An electronic device comprising:
a three-dimensional stacked memory device to store data, the memory device including:
multiple tiers of memory elements stacked adjacent each other, each tier including a memory element activated via a gate;
a channel extending through the multiple tiers of memory elements, the channel including doped polycrystalline (poly) material to produce a voltage differential across the gate; and
a source electrically coupled to the channel to provide charge carriers to the channel, the source including a metal silicide layer on a substrate, and a metal nitride layer between the metal silicide layer and the channel, wherein the metal nitride layer is processed onto the metal silicide layer without an intervening oxide layer; and
a touchscreen display coupled to generate a display based on data accessed from the memory elements.

11. The electronic device of claim 10, wherein the metal silicide layer comprises a silicide compound formed from silicon and a metal selected from: tungsten (W), titanium (Ti), nickel (Ni), cobalt (Co), tantalum (Ta), platinum (Pt), or molybdenum (Mo), or an alloy including at least one of the selected metals.

12. The electronic device of claim 10, wherein the metal nitride layer comprises a nitride compound formed from nitrogen and a refractory metallic element selected from: titanium (Ti), scandium (Sc), yttrium (Y), lanthanum (La), zirconium (Zr), vanadium (V), hafnium (Hf), tantalum (Ta), niobium (Nb), molybdenum (Mo), or tungsten (W), or an alloy including at least one of the selected metallic elements.

13. The electronic device of claim 10, wherein the metal silicide is processed on the substrate under vacuum, and the metal nitride is processed onto the metal silicide without breaking vacuum.

14. The electronic device of claim 13, the memory device further comprising:
an adhesion layer processed between the metal silicide and the metal nitride.

15. The electronic device of claim 10, the memory device further comprising:
a select gate source (SGS) layer adjacent the source, wherein the source is to provide dopants to the SGS layer to improve SGS threshold voltage (Vt) degradation.

16. The electronic device of claim 10, the memory device further comprising:
a silicon layer between the metal nitride layer and the channel.

17. The electronic device of claim 16, wherein the metal silicide is processed on the substrate under vacuum, the metal nitride is processed onto the metal silicide without breaking vacuum, and the silicon layer is processed on the metal nitride without breaking vacuum.

18. The electronic device of claim 16, wherein the silicon layer comprises a polysilicon layer.

19. A method comprising:
creating a source including a metal silicide layer on a substrate, and a metal nitride layer on the metal silicide layer, including processing the metal nitride layer onto the metal silicide layer without an intervening oxide layer;
generating a multitier stack of memory cells, each tier of the stack including a memory cell device activated via a gate; and
creating a channel extending through the multiple tiers of memory cells, the channel including doped polycrystalline (poly) material to conduct a current when a voltage differential across the gate activates the memory cells, the channel electrically coupled to the source for the source to provide charge carriers to the channel.

20. The method of claim 19, wherein creating the source without an intervening oxide layer further comprises:
processing the metal silicide on the substrate under vacuum; and
processing the metal nitride onto the metal silicide without breaking vacuum.

21. The method of claim 20, wherein creating the source further comprises:
depositing a silicon layer on the metal nitride layer.

22. The method of claim 21, wherein depositing the silicon layer on the metal nitride layer comprises processing the silicon layer without breaking vacuum.

23. The method of claim 21, wherein depositing the silicon layer comprises depositing a polysilicon layer.

* * * * *